United States Patent
Kim et al.

(10) Patent No.: US 8,129,917 B2
(45) Date of Patent: Mar. 6, 2012

(54) LIGHT EMITTING DEVICE FOR AC OPERATION

(75) Inventors: Dae Won Kim, Seoul (KR); Dae Sung Kal, Seongnam-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 380 days.

(21) Appl. No.: 12/442,800

(22) PCT Filed: Sep. 5, 2007

(86) PCT No.: PCT/KR2007/004268
§ 371 (c)(1), (2), (4) Date: Mar. 25, 2009

(87) PCT Pub. No.: WO2008/062941
PCT Pub. Date: May 29, 2008

(65) Prior Publication Data
US 2010/0072905 A1   Mar. 25, 2010

(30) Foreign Application Priority Data
Nov. 20, 2006  (KR) .................. 10-2006-0114553

(51) Int. Cl.
*H05B 37/00* (2006.01)
(52) U.S. Cl. .................. 315/246; 315/250; 315/251
(58) Field of Classification Search .............. 315/246, 315/250, 291, 307, 312, 251; 257/88, 99
See application file for complete search history.

(56) References Cited

U.S. PATENT DOCUMENTS

| 5,187,377 A | 2/1993 | Katoh |
| 7,804,098 B2* | 9/2010 | Lee et al. ............ 257/88 |
| 2004/0201988 A1 | 10/2004 | Allen |
| 2008/0099772 A1* | 5/2008 | Shuy et al. .......... 257/88 |
| 2008/0211421 A1* | 9/2008 | Lee et al. ............ 315/250 |

FOREIGN PATENT DOCUMENTS

| JP | 2004-029624 | 1/2004 |
| KR | 10-2005-0074491 | 7/2005 |
| KR | 10-2006-0078820 | 7/2006 |
| WO | 2004-023568 | 3/2004 |
| WO | 2006004337 A1 | 1/2006 |

OTHER PUBLICATIONS

Translation, Kazuteru Maruyama, Display Device Using Light Emitting Diode, p. 1-13, Jan. 29, 2004.*

* cited by examiner

*Primary Examiner* — David Hung Vu
(74) *Attorney, Agent, or Firm* — H.C. Park & Associates, PLC

(57) ABSTRACT

An AC light emitting device is disclosed. The AC light emitting device includes at least four substrates. Serial arrays each of which has a plurality of light emitting cells connected in series are positioned on the substrates, respectively. Meanwhile, first connector means electrically connect the serial arrays formed on respective different substrates. At least two array groups each of which has at least two of the serial arrays connected in series by the first connector means are formed. The at least two array groups are connected in reverse parallel to operate. Accordingly, there is provided an AC light emitting device capable of being driven under an AC power source.

5 Claims, 3 Drawing Sheets

LIGHT EMITTING DEVICE FOR AC OPERATION

CROSS REFERENCE TO RELATED APPLICATIONS

This application is the National Stage of International Application No. PCT/KR2007/004268, filed Sep. 5, 2007, and claims priority from and the benefit of Korean Patent Application No. 10-2006-0114553, filed on Nov. 20, 2006, which are both hereby incorporated by reference for all purposes as if fully set forth herein.

BACKGROUND OF THE INVENTION

1. Field of the Invention

The present invention relates to a light emitting device, and more particularly, to an AC light emitting device, which can be driven by being connected directly to an AC power source.

2. Discussion of the Background

With the development of GaN based light emitting diodes (LEDs), the GaN based LEDs have considerably changed LED technologies. Currently, the GaN based LEDs are used for various applications such as full-color LED displays, LED traffic lights, white LEDs and the like. Recently, it has been expected that high-efficiency white LEDs will substitute for fluorescent lamps. In particular, the efficiency of white LEDs has reached the level similar to that of typical fluorescent lamps.

In general, an LED emits light by forward current and requires the supply of DC. Hence, if the LED is connected directly to an AC power source, it is repeatedly turned on/off depending on the direction of current. As a result, there are problems in that the LED does not continuously emit light and is easily broken by reverse current.

To solve such a problem, an LED capable of being connected directly to a high-voltage AC power source is disclosed in PCT Patent Publication No. WO 2004/023568(A1), entitled "LIGHT-EMITTING DEVICE HAVING LIGHT-EMITTING ELEMENTS" by SAKAI et al.

According to PCT Patent Publication No. WO 2004/023568(A1), LEDs (i.e., light emitting cells) are two-dimensionally connected in series on a single insulative substrate such as a sapphire substrate to form LED arrays. Such two LED arrays are connected to each other in reverse parallel on the sapphire substrate. As a result, there is provided a single chip light emitting device capable of being directly driven by an AC power supply.

However, in the single chip light emitting device, a failure of any one of the light emitting cells connected in series or disconnection/short circuit of wires results in a chip failure that makes the AC operation of the device impossible. In particular, in a cast that the single chip includes a few tens of light emitting cells and wires for connecting them in series and reverse parallel so as to be driven under a high voltage, e.g., a 110/220V AC power source used for general household, a chip failure may be easily occurred due to a large number of the light emitting cells and the wires formed on the single chip.

Further, as a plurality of light emitting cells are connected in series and reverse parallel on the same substrate, it is likely that short circuits between wires for connecting the light emitting cells increase, and the processes of patterning the light emitting cells are complicated.

SUMMARY OF THE INVENTION

An object of the present invention is to provide an AC light emitting device, which can appropriately reduce the number of light emitting cells and wires formed on a single substrate.

Another object of the present invention is to provide an AC light emitting device capable of simplifying patterning and wire connecting processes of light emitting cells formed on a single substrate.

A further object of the present invention is to provide an AC light emitting device capable of preventing overvoltage from being applied to light emitting cells in an array to which reverse voltage is applied by an AC power source.

According to one aspect of the present invention for achieving the objects, an AC light emitting device includes at least four substrates. Serial arrays each of which has a plurality of light emitting cells connected in series are positioned on the substrates, respectively. Meanwhile, first connector means electrically connect the serial arrays formed on respective different substrates. At least two array groups each of which has at least two of the serial arrays connected in series by the first connector means are formed. The at least two array groups are connected in reverse parallel to operate. Accordingly, it is possible to provide an AC light emitting device capable of reducing the number of light emitting cells formed on a single substrate. Further, since all the light emitting cells formed on the single substrate can be connected in series, the patterning and wire forming processes of the light emitting cells can be simplified.

Meanwhile, at least one second connector means may electrically connect the first connector means corresponding to each other provided in the array groups connected in reverse parallel. The second connector means prevent overvoltage from being applied to a specific array in the array group to which reverse voltage is applied during operation. Accordingly, it is possible to protect the light emitting cells in the array group to which a reverse voltage is applied.

Meanwhile, bonding pads may be positioned on the respective substrates. The bonding pads are electrically connected to both ends of each of the serial arrays, and the first connector means connect the bonding pads to thereby connect the serial arrays in series.

The at least four substrates may be mounted in a single package. At this time, the first connector means may be bonding wires for directly connecting the bonding pads.

Meanwhile, the at least four substrates may be mounted in different packages, respectively. At this time, the bonding pads on the substrate are electrically connected to lead electrodes in a package, and the lead electrodes of such packages are electrically connected to one another, thereby forming array groups connected in series. Here, the bonding pads may be connected to the lead electrodes in the package in various manners. For example, the bonding pads may be connected through bonding wires.

The number of substrates mounted in one package may vary. For example, one substrate is mounted in one package, and at least four or more of such packages are connected to one another to thereby form an AC light emitting device. Further, at least two or more substrates are mounted in each package and connected in series to form an array group and such packages are connected to one another, whereby an AC light emitting device can be configured. Furthermore, at least two or more substrates are mounted in each package and connected in reverse parallel and such packages are connected to one another, whereby an AC light emitting device having array groups with the serial arrays connected in series can be configured.

According to another aspect of the present invention for achieving the objects, an AC light emitting device includes at least two substrates. First and second serial arrays connected in reverse parallel are positioned on each of the substrates. The serial arrays are formed by connecting a plurality of light emitting cells in series to one another. Meanwhile, first connector means electrically connect serial arrays to each other on the respective different substrates to thereby form at least two array groups. Further, second connector means are formed on the substrates, respectively, to electrically connect the light emitting cells corresponding to each other provided in the first and second arrays connected in reverse parallel.

According to embodiments of the present invention, a plurality of single chips having an serial array of light emitting cells are used, whereby the number of the light emitting cells and wires formed on a single substrate can be appropriately reduced. Accordingly, a chip failure rate in a manufacturing process can be decreased, thereby reducing manufacturing costs. Further, since it is not required to connect light emitting cells formed on a single substrate in reverse parallel, the patterning and wire connecting process of the light emitting cells formed on the single substrate can be simplified. Furthermore, second connector means for connecting array groups to one another are employed, thereby providing an AC light emitting device capable of preventing overvoltage from being applied to light emitting cells in an array to which a reverse voltage is applied. In addition, since a plurality of single chips are used, the single chips for emitting lights with different light emitting wavelengths can be disposed, thereby providing an AC light emitting device for emitting lights with various wavelengths.

DETAILED DESCRIPTION OF THE ILLUSTRATED EMBODIMENTS

Figure 1:
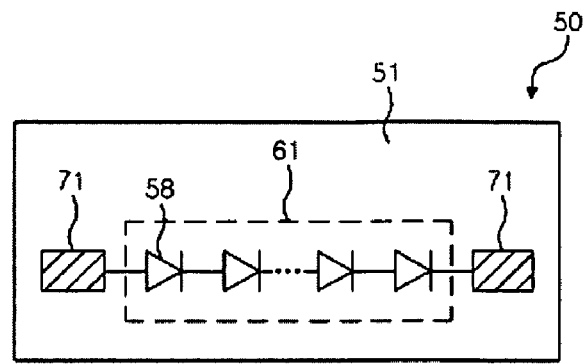
FIG. 1 is a schematic view illustrating a serial array of light emitting cells according to embodiments of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

FIG. 1 is a schematic view illustrating a serial array of light emitting cells according to embodiments of the present invention. Here, the serial arrays are disposed in a single chip 50.

Referring to FIG. 1, the single chip 50 includes a substrate 51. The substrate 51 may be an insulative substrate or a conductive substrate having an insulating layer on a top surface thereof. A plurality of light emitting cells 58 are disposed on the substrate 51. The light emitting cells are serially connected to one another through wires to form a serial array 61. Bonding pads 71 may be disposed at both ends of the serial array 61. The bonding pads 71 are electrically connected to both ends of the serial array 61, respectively.

In the embodiments of the present invention, all the light emitting cells in the single chip 50 may be connected in series on a single substrate. Hence, the processes of forming the light emitting cells 58 on a single substrate and forming wires for connecting the light emitting cells 58 are more simplified as compared with a related art.

Figure 2:
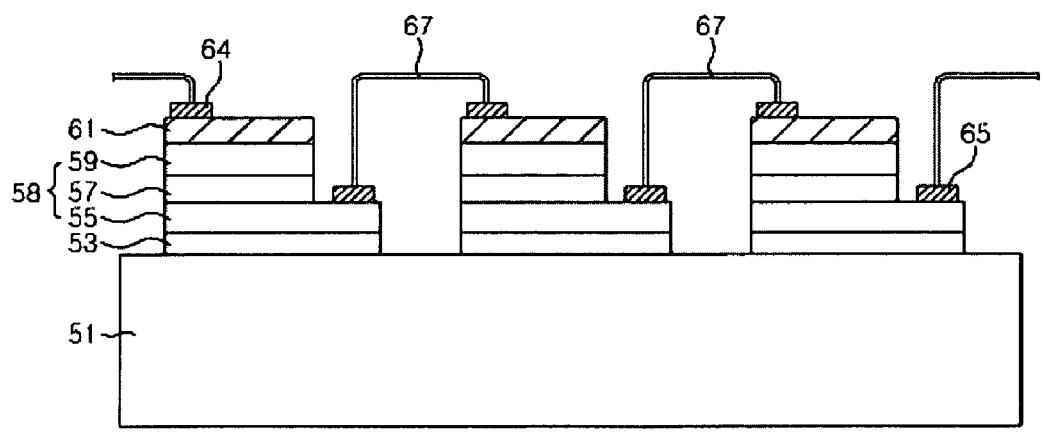
FIGS. 2 and 3 are partial sectional views illustrating the light emitting cells used in the embodiments of the present invention.
Figure 3:
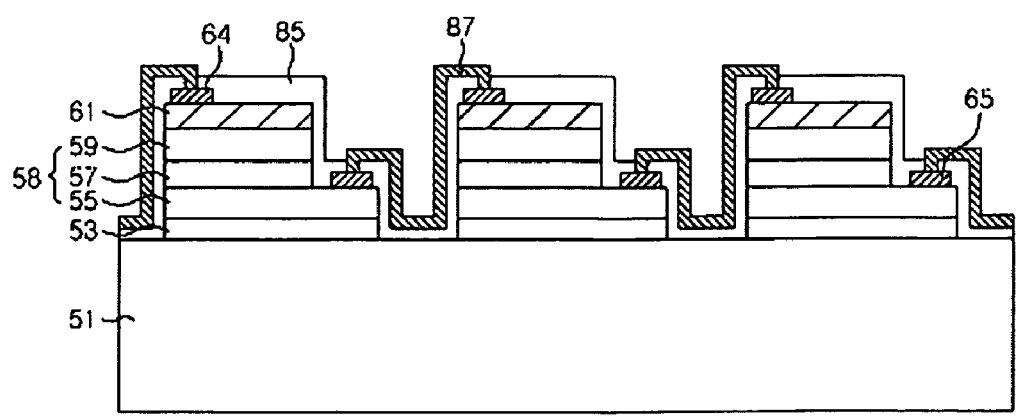

FIGS. 2 and 3 are partial sectional views illustrating the light emitting cells. Here, FIG. 2 is a partial sectional view illustrating the light emitting cells connected in series through wires formed through an air bridge process, and FIG. 3 is a partial sectional view illustrating the light emitting cells connected in series through wires formed through a step cover process.

Referring to FIG. 2, a plurality of light emitting cells 58 are positioned on a substrate 51 to be spaced apart from one another. Each of the light emitting cells 58 comprises a first conductive-type lower semiconductor layer 55, an active layer 57 and a second conductive-type upper semiconductor layer 59. The active layer 57 may be formed in a single or multiple quantum well structure, and the material and composition of the active layer may be selected depending on a required light emitting wavelength. For example, the active layer may be formed of a GaN-based compound semiconductor. Meanwhile, the lower and upper semiconductor layers 55 and 59 may be formed of a material with a bandgap larger than the active layer 57, and may be formed of a GaN-based compound semiconductor.

Meanwhile, a buffer layer 53 may be interposed between the lower substrate 55 and the substrate 51. The buffer layer 53 is employed to reduce lattice mismatch between the substrate 51 and the lower semiconductor layer 55. Although the buffer layers 53 may be spaced apart from one another as shown in this figure, the present invention is not limited thereto. That is, when the buffer layers 53 are formed of an insulative material or a material with large resistance, they may be continuously formed.

As shown in this figure, the upper semiconductor layer 59 is positioned on a region of the lower semiconductor layer 55, and the active layer 57 is interposed between the upper and lower semiconductor layers 59 and 55. Further, a transparent electrode layer 61 may be positioned on the upper semiconductor layer 59. The transparent electrode layer 61 may be formed of a material including indium tin oxide (ITO), Ni/Au, or the like.

Meanwhile, wires 67 electrically connect the light emitting cells 58 to one another. Each of the wires 67 connects the lower semiconductor layer 55 of one of the light emitting cells to the transparent electrode layer 61 of another of the light emitting cells adjacent thereto. As shown in this figure, the wires may connect an electrode pad 64 formed on the transparent electrode layer 61 and an electrode pad 65 formed on the exposed region of the lower semiconductor layer 55. Here, the wires 67 are formed through an air bridge process. Accordingly, the wires 67 except contacts are physically separated from the substrate and the light emitting cells 58. The serial array 61 (in FIG. 1) having the light emitting cells connected in series on the single substrate 51 through the wires 67 is formed.

Referring to FIG. 3, wires for connecting the light emitting cells 58 can be formed through a step cover process. That is, all the layers of the light emitting cells and the substrate 51 except portions to which the wires 87 are connected are covered with an insulating layer 85. In addition, the wires 87 are patterned on the insulating layer 85 to electrically connect the light emitting cells 58 to one another.

For example, the insulating layer 85 has openings for exposing the electrode pads 64 and 65. The wires 87 connect the electrode pads 64 and 65 of the adjacent light emitting cells to each other through the openings, thereby connecting the light emitting cells in series.

Figure 4:
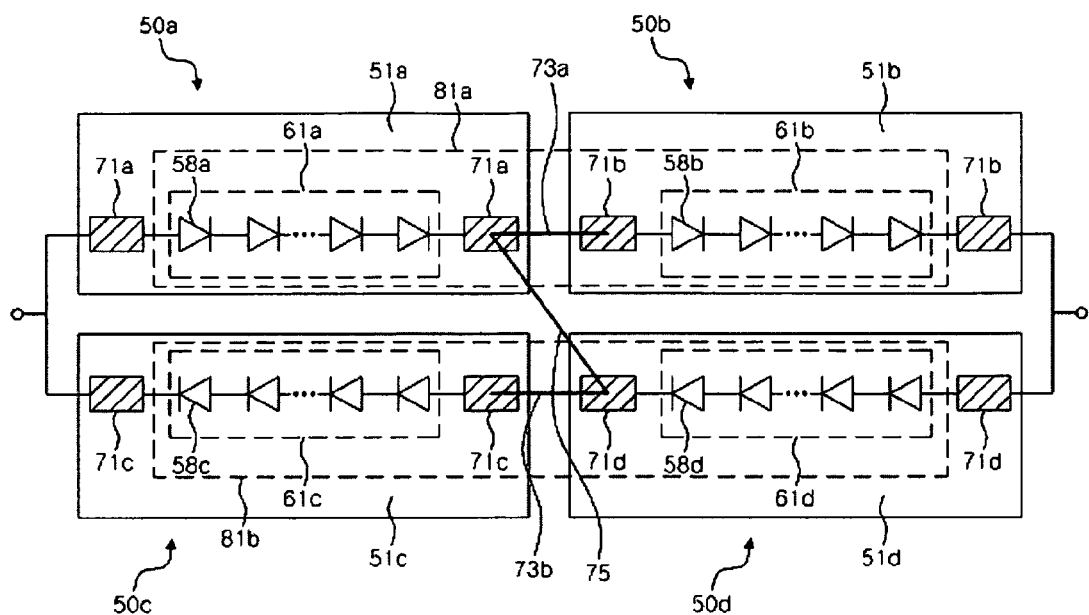
FIG. 4 is a schematic view of an AC light emitting device according to an embodiment of the present invention.

FIG. 4 is a schematic view of an AC light emitting device according to an embodiment of the present invention.

Referring to FIG. 4, the AC light emitting device comprises four single chips 50a, 50b, 50c and 50d. Each of the single chips 50a, 50b, 50c and 50d has the same components as the single chip 50 described with reference to FIG. 1. For convenience, a, b, c and d are added to reference numerals of the respective components.

Light emitting cells 58a, 58b, 58c or 58d connected in series on a single substrate 51a, 51b, 51c or 51d constitute a serial array 61a, 61b, 61c or 61d. Meanwhile, bonding pads 71a, 71b, 71c or 71d may be connected to both ends of each serial array 61a, 61b, 61c or 61d.

Meanwhile, the two serial arrays 61a and 61b are connected in series to each other to form an array group 81a, and the other two serial arrays 61c and 61d are connected in series to each other to form an array group 81b. The serial arrays are connected in series through first connector means 73a and 73b.

The first connector means 73a may be a bonding wire for directly connecting the bonding pads 71a and 71b. Further, the first connector means 73b may be a bonding wire for directly connecting the bonding pads 71c and 71d. However, the first connector means 73a and 73b are not limited to bonding wires for directly connecting the bonding pads, but may be various connector means including lead terminals of a package, circuit patterns of a printed circuit board, or the like.

Meanwhile, the array groups 81a and 81b are connected in reverse parallel to each other to operate. That is, an anode of the array group 81a and a cathode of the array group 81b are commonly connected to a terminal, and a cathode of the array group 81a and an anode of the array group 81b are commonly connected to a terminal. For example, as shown in this figure, the bonding pads 71a and 71b at both the ends of the array group 81a and the bonding pads 71c and 71d at both the ends of the array group 81b may be respectively connected to the common terminals such that the array groups 81a and 81b are connected in reverse parallel to each other. Accordingly, an AC power source is connected to the terminals to thereby drive the four single chips 50a, 50b, 50c and 50d, and the array groups 81a and 81b alternately operate depending on a change in phase of the AC power source.

Meanwhile, a second connector means 75 may electrically connect the array groups 81a and 81b to each other. Although the second connector means 75 may connect the bonding pad 71a between the arrays 61a and 61b and the bonding pad 71d between the arrays 61c and 61d to each other as shown in this figure, the present invention is not limited thereto. That is, the second connector means 75 may connect the bonding pads 71a and 71c and/or the bonding pads 71b and 71d. The second connector means 75 may also connect the bonding pads 71b and 71d to each other. Further, the second connector means 75 may directly connect to the first connector means 73a and 73b. The first connector means are electrically connected to each other by the connection of the second connector means 75.

Like the first connector means 73a and 73b, the second connector means 75 may be a bonding wire for directly connecting bonding pads, or a connector means including a lead electrode or a conductive pattern of a printed circuit board.

If voltage is applied under an AC power source, forward voltage is applied to any one of the array groups 81a and 81b, and reverse voltage is applied to the other array group. In the array group to which the reverse voltage is applied, uniform voltage is not applied to light emitting cells, and overvoltage may be partially applied to specific light emitting cells. The second connector means 75 controls the potential between the serial arrays in the array group, to which the reverse voltage is applied, using the potential between the serial arrays in the array group, to which the forward voltage is applied. Accordingly, overvoltage can be prevented from being applied to a specific array in the array group to which the reverse voltage is applied, thereby protecting the light emitting cells.

In the meantime, although all the light emitting cells 58a, 58b, 58c and 58d in the single chips 50a, 50b, 50c and 50d may be formed to emit light with the same light emitting wavelength, the present invention is not limited thereto but may be formed to emit lights with different wavelengths. Thus, according to the embodiments of the present invention, there may be provided an AC light emitting device for emitting light with various wavelengths as well as an AC light emitting device for emitting light with a single wavelength.

Figure 5:
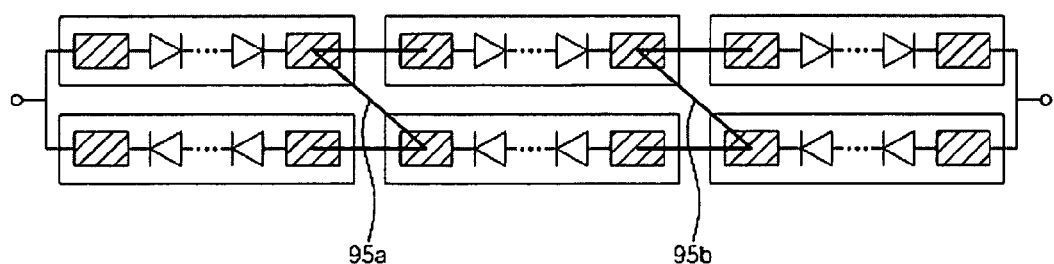
FIG. 5 is a schematic view of an AC light emitting device according to another embodiment of the present invention.

Meanwhile, although it has been described in this embodiment that the arrays in the two single chips are connected in series to each other, thereby forming the array group, the array group may have two or more serial arrays formed therein. FIG. 5 is a schematic view of an AC light emitting device according to another embodiment of the present invention, in which an AC light emitting device comprises array groups each of which has three or more serial arrays.

Referring to FIG. 5, the AC light emitting device according to this embodiment is the same as the light emitting device except the number of single chips. That is, in this embodiment, three of the single chips are connected in series to form an array group, and the other three single chips are connected in series to form another array group. These array groups are connected in reverse parallel to each other.

Meanwhile, second connector means 95a and 95b are electrically connect the first connector means corresponding to each other provided in the array groups as shown in this figure. Accordingly, overvoltage can be prevented from being applied to a specific array in an array group to which reverse voltage is applied, thereby protecting light emitting cells.

Figure 6:
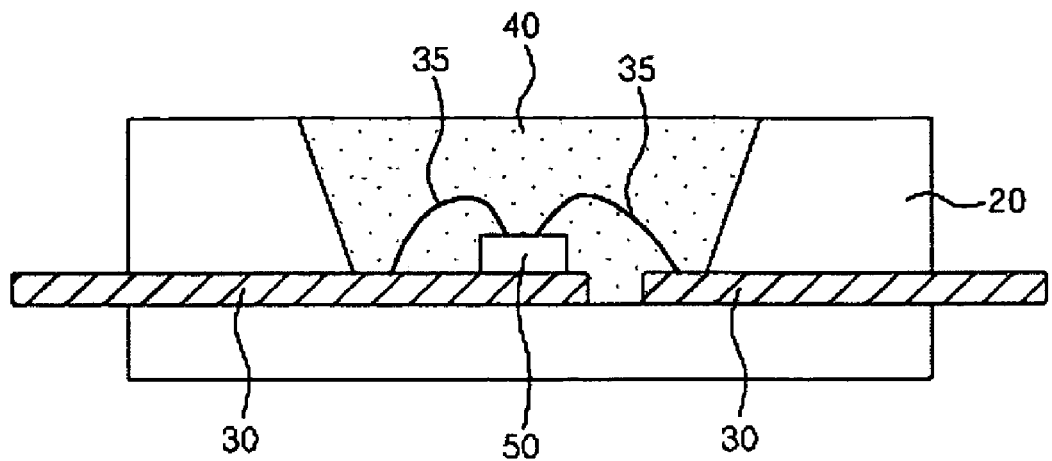
FIG. 6 is a sectional view illustrating a package used in the embodiments of the present invention.

FIG. 6 is a sectional view illustrating a package on which the single chip 50 used in the embodiments of the present invention is mounted. Here, a top-view light emitting device having a recessed package body 20 will be described as an example. However, the present invention is not be limited thereto, but may be applied to all types of packages.

Referring to FIG. 6, the single chip 50 of FIG. 1 is mounted on a mounting region of the package body 20. The single chip 50 is electrically connected to lead electrodes 30 of the package through bonding wires 35. Meanwhile, the single chip 50 is encapsulated by a molding member 40 such as epoxy or silicone. The molding resin 40 may contain a phosphor.

According to this embodiment, there is provided a package with a single chip 50 mounted thereon. Such packages are connected in series, thereby forming array groups each of which has the single chips 50 connected in series. Further, such array groups are connected in reverse parallel, thereby providing an AC light emitting device of the present invention, which can be driven under an AC power source.

Meanwhile, a plurality of the single chips 50 may be mounted in a single package. For example, two or more single chips 50 are mounted in a package and connected in series, and such two packages are connected in reverse parallel, thereby providing the AC light emitting device of the present invention.

The packages may be connected in series, parallel or reverse parallel using lead terminals. The packages may also be connected using a conductive pattern on a printed circuit board on which the packages are mounted.

Meanwhile, at least four single chips may be mounted in one package. As described in FIGS. 4 and 5, the single chips constitute at least two array groups using bonding wires or the like, and the array groups are connected in reverse parallel, thereby providing an AC light emitting device using a single package.

Figure 7:
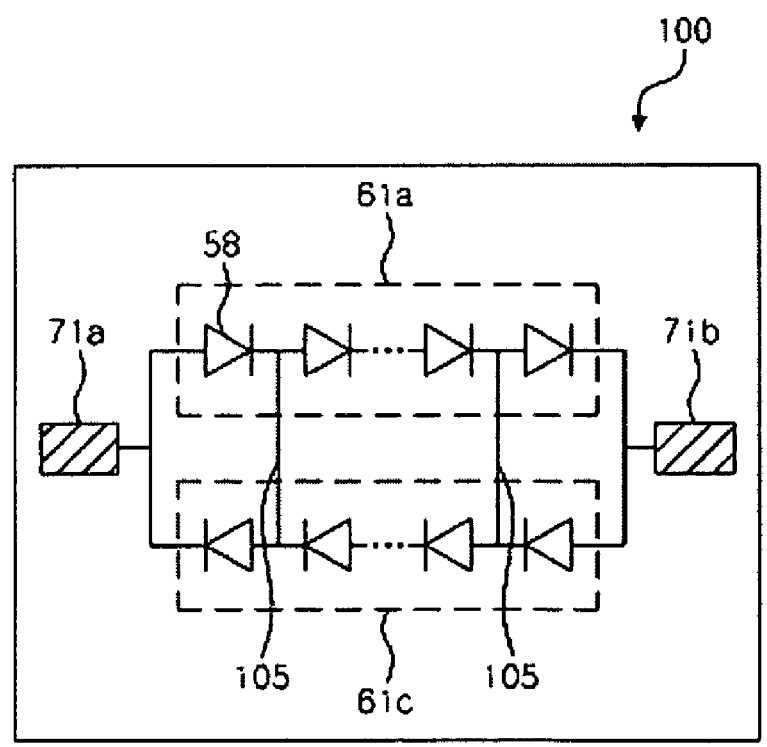
FIG. 7 is a schematic view illustrating serial arrays of light emitting cells according to a further embodiment of the present invention.

Although an AC light emitting device using a single chip having one serial array on a substrate has been described in the foregoing, an AC light emitting device may be configured using single chips having serial arrays connected in reverse parallel on a substrate. FIG. 7 is a schematic view illustrating an AC light emitting device using a single chip 100 having serial arrays connected in reverse parallel on a single substrate.

Referring to FIG. 7, two serial arrays 61a and 61c, each of which has light emitting cells 58 connected in series, are disposed on a substrate 51. The serial arrays 61a and 61c are connected in reverse parallel to each other between bonding pads 71a and 71b.

Such single chips 100 are connected in series by first connector means, thereby forming at least two array groups. The first connector means may be bonding wires for directly connecting the bonding pads. That is, the array groups may be formed by mounting the single chips in a package and then connecting them through bonding wires. As described above, the array groups may be formed by mounting the respective single chips 100 in packages and then connecting the packages in series to one another. Various serial array groups may also be formed using single chips and packages.

Meanwhile, the light emitting cells 58 corresponding to each other provided in the arrays 61a and 61c formed on the same substrate are electrically connected by second connector means 105. The second connector means 105 prevent overvoltage from being applied to the light emitting cells in the array to which reverse voltage is applied. The second connector means 105 may be a first conductive-type lower semiconductor layer which the adjacent light emitting cells 58 share. Alternatively, the second connector means 105 may be wires formed on the substrate to connect the adjacent light emitting cells.

According to this embodiment, single chips 100 having serial arrays of light emitting cells connected in reverse parallel are directly connected to form array groups, so that the number of light emitting cells in a serial array on a single substrate can be reduced.

The invention claimed is:

1. An alternating current (AC) light emitting device, comprising:
   at least two substrates;
   a first serial array and a second serial array positioned on each of the substrates, the first serial array and the second serial array being connected in reverse parallel to each other, each of the first serial array and the second serial array comprising a plurality of light emitting cells connected in series, the first serial array and the second serial array configured to be driven by an AC voltage;
   first wires for electrically connecting serial arrays to each other on the respective different substrates, thereby forming at least two array groups; and
   second wires respectively formed on the substrates to electrically connect the light emitting cells corresponding to each other provided in the first serial array and the second serial array.

2. The AC light emitting device as claimed in claim 1, wherein the first wires comprise bonding wires for connecting the serial arrays on the respective different substrates.

3. The AC light emitting device as claimed in claim 2, wherein the first wires comprise lead electrodes in a package.

4. The AC light emitting device as claimed in claim 1, further comprising:
   a first bonding pad and a second bonding pad positioned on each of the substrates,
   wherein the first serial array and the second serial array are connected in reverse parallel to each other between the first and second bonding pads.

5. The AC light emitting device as claimed in claim 4, wherein a first wire among the first wires electrically connects the first bonding pad of one of the at least two substrates to the second bonding pad of the other of the at least two substrates.

* * * * *